United States Patent
Young et al.

[11] Patent Number: 5,534,779
[45] Date of Patent: Jul. 9, 1996

[54] MAGNET SYSTEMS

[75] Inventors: Ian R. Young, Marlborough; John F. Eastham, Avon, both of England

[73] Assignee: Picker International, Inc., Cleveland, Ohio

[21] Appl. No.: 390,024

[22] Filed: Feb. 17, 1995

[30] Foreign Application Priority Data

Feb. 22, 1994 [GB] United Kingdom .................. 9403321

[51] Int. Cl.$^6$ .................................................. G01V 3/00
[52] U.S. Cl. ........................................ 324/319; 335/216
[58] Field of Search ............................ 324/320, 319, 324/318, 307, 309; 128/653.5; 335/216, 296, 297

[56] References Cited

U.S. PATENT DOCUMENTS

| | | | |
|---|---|---|---|
| 4,656,449 | 4/1987 | Mallard et al. | 335/297 |
| 5,008,624 | 4/1991 | Yoshida | 324/318 |
| 5,079,533 | 1/1992 | Hed | 335/216 |
| 5,138,326 | 8/1992 | Edwards et al. | 324/319 |

FOREIGN PATENT DOCUMENTS

| | | |
|---|---|---|
| 9004258 | 4/1990 | WIPO . |
| 9315514 | 8/1993 | WIPO . |

OTHER PUBLICATIONS

Eastham, et al.; "Preliminary Investigation Of The Utility Of High Temperature Superconductor As A Means Of Stabilising A Resistive NMR Magnet;" Applied Superconductivity; vol. 1, Nos. 10–12 pp. 1849–1854; 1993.

*Primary Examiner*—Louis M. Arana
*Attorney, Agent, or Firm*—Timothy B. Gurin; John J. Fry

[57] ABSTRACT

In a magnet system, e.g. for use in a magnetic resonance apparatus, wherein a magnetic field is produced in a gap between pole pieces (5) joined by a yoke (7) by an electric drive coil arrangement carried on the yoke, stabilisation against variations in the field in the gap is provided by a stabilising arrangement (43) wherein over a section of its length the yoke is divided into a plurality of discrete parallel finger-like portions (45) each of which is surrounded by a separate ring (47) of superconducting non-magnetic material.

9 Claims, 3 Drawing Sheets

MAGNET SYSTEMS

This invention relates to magnet systems.

More particularly the invention relates to magnet systems suitable for use in magnetic resonance imaging apparatus. Such apparatus finds particular application in the medical examination of patients for diagnostic purposes.

In magnetic resonance imaging apparatus the object to be imaged is required to be positioned during imaging in an extremely homogeneous static magnetic field of high strength which defines the equilibrium axis of magnetic alignment of the nuclei within the object.

In magnetic resonance imaging apparatus using a static magnetic field of relatively low strength, the static magnetic field is often produced in a gap between a pair of pole pieces joined by a yoke of magnetic material carrying an electric drive coil arrangement which, when energised, produces a magnetic field in the yoke and hence across the gap.

It has been proposed to stabilise the field in the gap of such a magnet system by surrounding the yoke at some point between the pole pieces with a ring of superconducting material. Any tendency for the magnetic field in the yoke to change results in an induced current in the ring which in turn produces a magnetic field in the yoke which opposes the original change in the field in the yoke.

In known such magnet systems the ring consists of a low temperature superconducting material and a cryogen capable of maintaining the ring at the temperature of liquid helium is required.

In recent times various materials which exhibit superconducting properties at relatively high temperatures, e.g. liquid nitrogen temperature, have been discovered. Unfortunately these materials are very brittle and it has consequently not proved practicable to use them in field stabilising arrangements for magnetic systems of the size typically required in magnetic resonance imaging apparatus.

It is an object of the present invention to provide a magnet system of a form such that a superconducting field stabilising arrangement using high temperature superconducting materials may be provided in the system.

According to the present invention there is provided a magnet system suitable for use in a magnetic resonance apparatus, wherein a magnetic field is produced in a gap between a pair of pole pieces joined by a yoke of magnetic material by an electric drive coil arrangement carried by the yoke, the system incorporating a superconducting magnetic field stabilising arrangement, characterised in that over a section of its length the yoke is divided into a plurality of discrete parallel portions, and the superconducting magnetic field stabilising arrangement comprises a plurality of superconducting non-magnetic material rings each of which surrounds a respective said portion of the yoke.

In a magnetic system according to the invention the rings suitably share a common cryogenic arrangement.

Suitably said portions of the yoke are of substantially the same cross-sectional area and substantially equispaced from one another.

It will be understood that in a magnet system according to the present invention, the superconducting rings are required to generate only a small proportion of the total magnetomotive force (m.m.f.) required in the gap between the pole pieces of the magnet system, i.e. sufficient only to compensate for variations in the m.m.f. produced by the electric drive coil. In a typical system the instability of the current in the electric drive coil is less than 1% so that, with 100% reserve, the superconducting rings are required to generate no more than 2% of the total m.m.f. needed. The size of the superconducting rings in a system according to the invention can therefore be very much less, e.g. by a factor of 50, than in a comparable system wherein superconducting rings are used to generate the whole of the m.m.f. required, such as is described in WO 90/04258 A1.

One magnetic resonance imaging apparatus incorporating a magnetic system in accordance with the invention will now be described, by way of example, with reference to the accompanying drawings in which.

Figure 1:
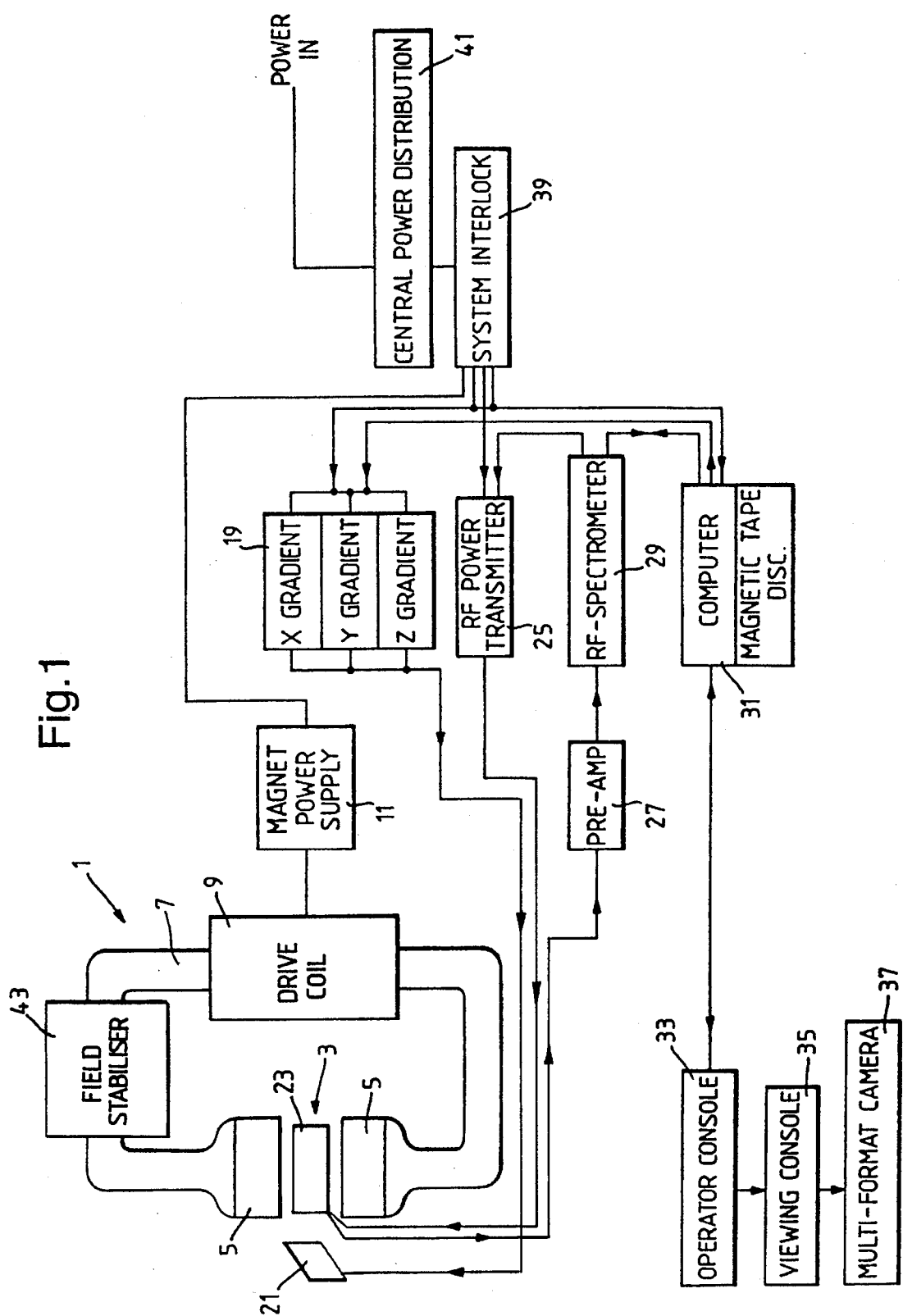
FIG. 1 is a schematic diagram of the apparatus.

Referring to FIG. 1, the imaging apparatus includes a magnet system 1 whereby a homogeneous static magnetic field is produced in a gap 3 defined by two pole pieces 5. The magnetic system further includes a yoke 7 of magnetic material which carries a cryogenic drive coil arrangement 9 arranged for energisation from a power supply 11.

In operation of the apparatus the object to be imaged is positioned in the gap 3.

The gap 3, when being used for imaging, is associated with three sets of magnetic field gradient coils of known form for imposing nominally linear magnetic field gradients on the static field in three orthogonal directions, under control of a gradient field controller 19. These gradient fields are used for selection of the region of an object under examination to be imaged, and spatial encoding of nuclear magnetic spins in known manner. In the drawing only one coil 21 in the gap 3 is shown by way of example.

In addition, during imaging the gap 3 is associated with RF coils 23 of known form connected to a transmitter 25 to excite nuclear magnetic spins in the object under examination, and to pick up the radio frequency signals generated by the spins excited in the object.

The signals picked up by coils 23 are amplified in a pre-amplifier 27 and analysed and processed in an RF spectrometer 29 and computer 31 under the control of an operator console 33, the console 33 being linked with an image viewing console 35 and a multi-format camera 37 unit for recording images. The overall operation of the imaging apparatus is controlled by the computer 31 in conjunction with a system interlock 39 via which electric power is passed from a central power distribution system 41 to the RF transmitter 25, gradient field controller 19 and main magnet supply 11, in dependence on instructions passed to the computer 31 from the operator console 33.

In order to stabilise the static magnetic field in the gap 3 in operation, the yoke 1 is provided with an arrangement indicated generally at 43 in FIG. 1.

Figure 2:
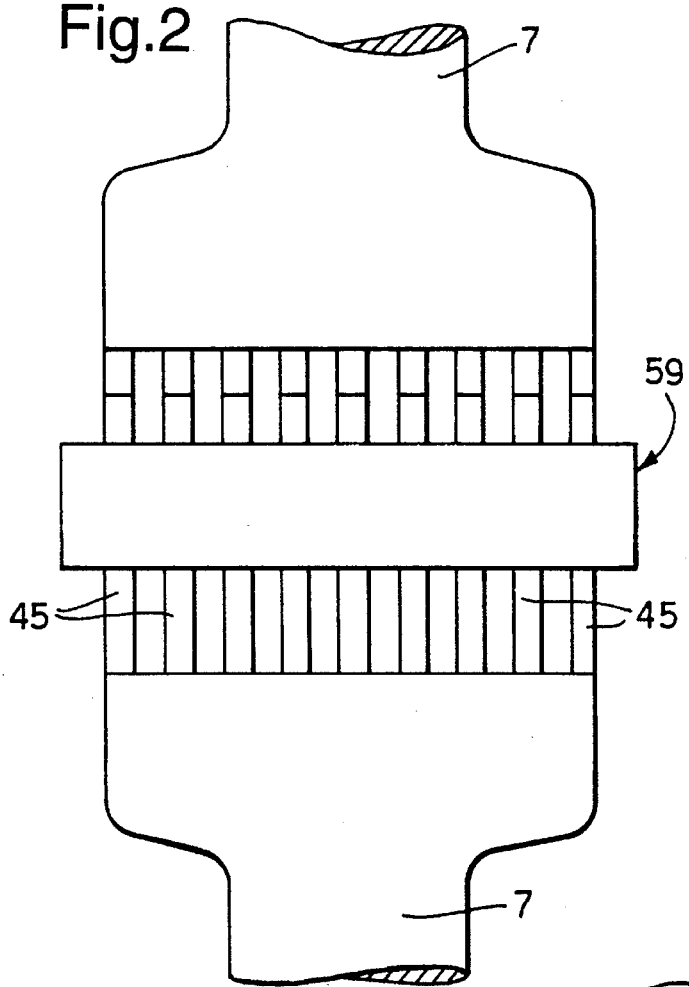
FIG. 2 is a diagrammatic view of a superconducting field stabilising arrangement of the magnetic system of the apparatus of FIG. 1.
Figure 3:
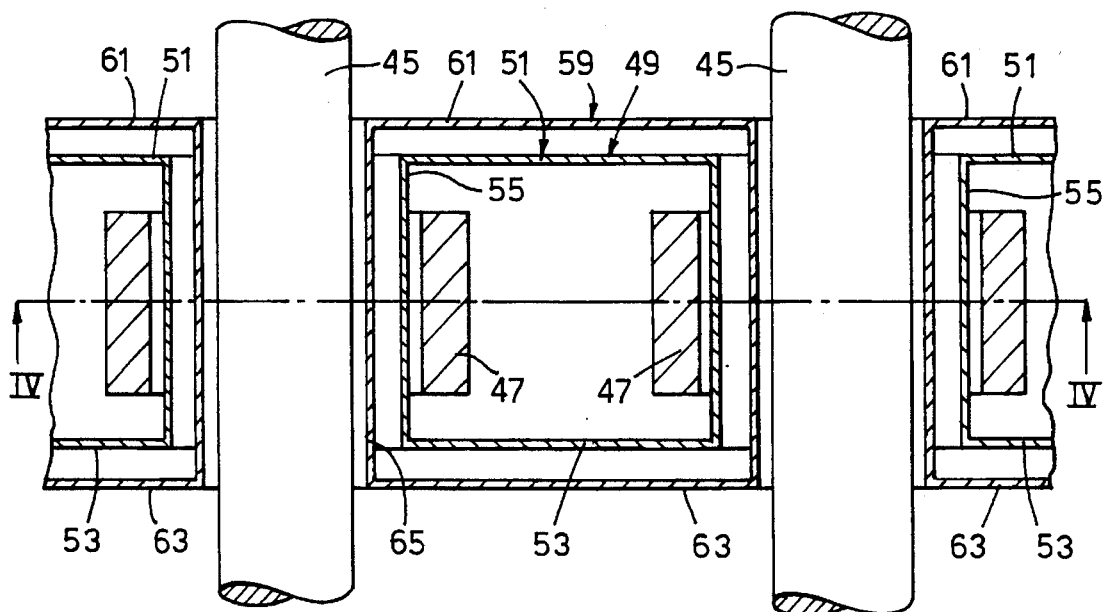
FIG. 3 is a sectional side view of part of the arrangement.
Figure 4:
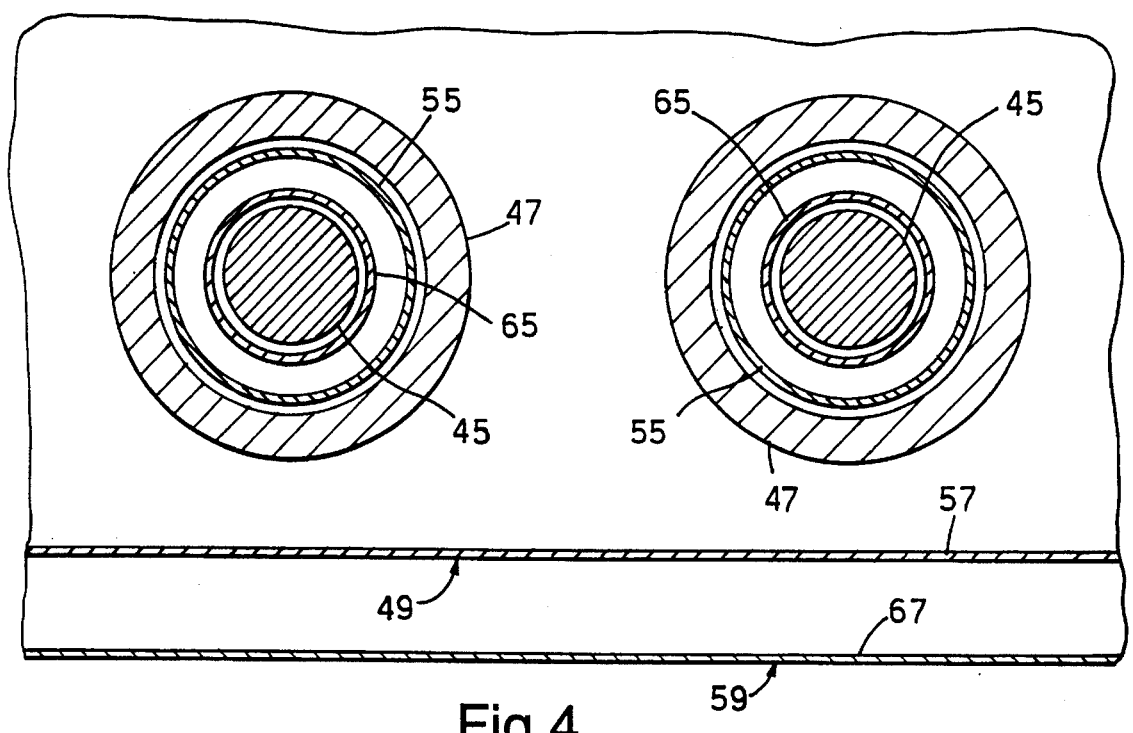
FIG. 4 is a sectional plan view of part of the arrangement.

Referring to FIGS. 2 to 4, in the arrangement 43 the yoke 7 divides into a plurality of parallel discrete finger-like portions 45, the portions 45 each being of the same circular cross-sectional area, and being approximately equispaced from one another. Each portion 45 is surrounded by a separate tubular ring 47 of a high temperature non-magnetic superconducting material, such as yttrium barium copper oxide, the rings 47 being housed in a common cryogenic enclosure 49 filled with a suitable cryogen material such as liquid nitrogen. To facilitate assembly the portions 45 are each broken adjacent the enclosure 49 to allow the yoke 7 to be split into two parts.

Typically each finger 45 has a diameter of about 3 to 5 cms, the total cross-sectional area of the fingers 45 being approximately equal to the cross-sectional area of the sections of the yoke 7 not divided into fingers, which sections typically have a diameter of about 25 cms.

Referring particularly to FIGS. 3 and 4, the enclosure 49, which can conveniently be made of a glass reinforced plastics or like material, comprises parallel planar end walls 51 and 53 with tubular walls 55 extending therebetween through which the portions 45 of the yoke 7 respectively coaxially extend, the walls 55 each being coaxially aligned with respective circular apertures extending through the end walls 51 and 53. The rings 47 are thus all housed in a single common cryogenic enclosure defined by the facing surfaces of end walls 51 and 53, the outer curved surfaces of tubular walls 55 and an outer enclosure wall 57 (see FIG. 4).

To avoid massive leakage of cryogen material from the enclosure 49 a vacuum enclosure 59 surrounds the enclosure 49. The enclosure 59 comprises planar end walls 61 and 63 respectively parallel to and spaced from the end walls 51 and 53 of the cryogen enclosure 49, tubular walls 65 extending coaxially through tubular walls 55 between the end walls 61 and 63, and through which the portions 45 of the yoke respectively coaxially extend, the walls 61 and 63 each being coaxially aligned with respective circular apertures extending through the end walls 61 and 63, and the vacuum enclosure 59 being completed by an outer wall 67 (see FIG. 4). The walls of enclosure 59 are suitably made of the same material as the cryogen enclosure, e.g. glass reinforced plastics material.

The splitting of the yoke 7 into a plurality of discrete portions or fingers allows the superconducting material of the field stabilising arrangement to be in the form of a number of relatively small rings, one surrounding each finger. As a result it is practicable to make the rings of high temperature superconducting material despite the brittle nature of such material. Furthermore, even if a few of the rings do crack in use, e.g. due to thermal shock, performance loss is relatively small.

A further advantage of the magnet system is that rings of superconducting of the same size may be used regardless of the overall cross-sectional area of the yoke.

It will be appreciated that in the embodiment described above with reference to the drawings the fingers are substantially the same cross-sectional area and equispaced as a manufacturing convenience. However, in other embodiments in accordance with the invention the cross-sectional areas of the fingers may differ so that each finger exhibits substantially the same magnetic reluctance, i.e. the outer fingers may have a larger cross-sectional area than the inner fingers.

Figure 5:
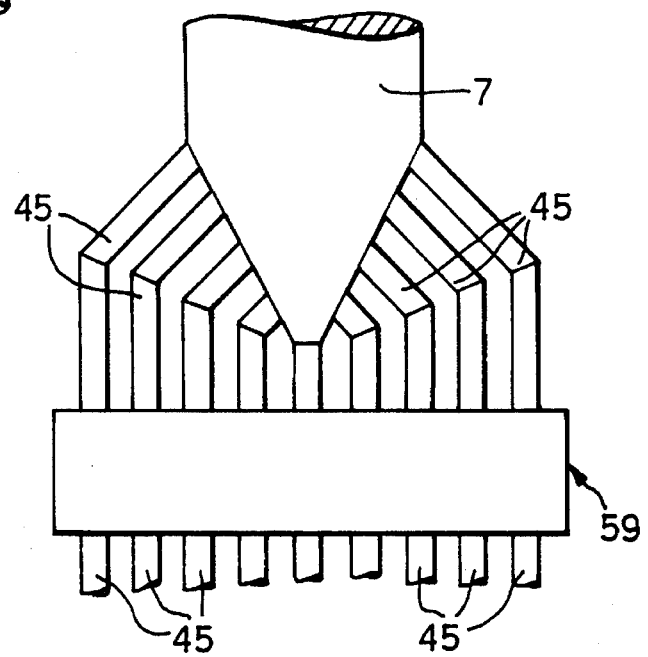
FIG. 5 is a diagrammatic view of an alternative form of part of the field stabilising arrangement.

Similarly, whilst the fingers 45 in the embodiment described with reference to the drawings project normally from parallel end faces of the adjacent undivided parts of the yoke 7, these end faces and/or the fingers may be shaped with a view to optimising flux distribution in the fingers e.g. as illustrated in FIG. 5 where the end faces are conical and the fingers 45 are cranked to meet the end faces approximately normally.

We claim:

1. A magnet system, suitable for use in a magnetic resonance apparatus, comprising: a pair of pole pieces which define a gap; a yoke of magnetic material which extends between the pole pieces; an electric drive coil arrangement which is carried on the yoke and produces a magnetic field in the yoke and hence across the gap, a section of the length the yoke being divided into a plurality of discrete portions; and a superconducting magnetic field stabilising arrangement comprising a plurality of superconducting non-magnetic material rings each of which surrounds a respective said portion of the yoke.

2. A system according to claim 1 further including a cryogenic arrangement which is shared by the rings.

3. A system according to claim 1 wherein said portions of the yoke are of substantially the same cross-sectional area and equispaced from one another.

4. A system according to claim 1 wherein said portions are differently shaped so as to tend to equalise their magnetic reluctances.

5. A system according to claim 4 wherein said portions are of different cross-sectional areas.

6. A system according to claim 1 wherein said portions are of circular cross-section.

7. A system according to claim 1 wherein said portions extend between conical end faces of adjacent undivided parts of said yoke.

8. A system according to claim 1 wherein said superconducting material is yttrium barium copper oxide.

9. A magnetic resonance apparatus incorporating a magnet system for applying a magnetic field to a subject to be examined in use of the apparatus to establish an equilibrium axis of magnet alignment in the subject, the magnet system comprising: a pair of pole pieces which define a gap in which said subject is positioned during examination; a yoke of magnetic material which extends between the pole pieces; an electric drive coil arrangement which is carried on the yoke and produces a magnetic field in the yoke and hence across the gap, a section of the length of the yoke being divided into a plurality of discrete portions; and a superconducting magnetic field stabilising arrangement comprising a plurality of superconducting non-magnetic material rings each of which surrounds a respective said portion of the yoke.

* * * * *